United States Patent
Yuzawa

(10) Patent No.: US 7,081,590 B2
(45) Date of Patent: Jul. 25, 2006

(54) WIRING BOARD AND METHOD OF FABRICATING TAPE-LIKE WIRING SUBSTRATE

(75) Inventor: Hideki Yuzawa, Iida (JP)

(73) Assignee: Seiko Epson Corporation, Tokyo (JP)

(*) Notice: Subject to any disclaimer, the term of this patent is extended or adjusted under 35 U.S.C. 154(b) by 273 days.

(21) Appl. No.: 10/370,289

(22) Filed: Feb. 19, 2003

(65) Prior Publication Data
US 2003/0174483 A1    Sep. 18, 2003

(30) Foreign Application Priority Data
Feb. 27, 2002    (JP) .............................. 2002-051340

(51) Int. Cl.
*H05K 1/00*    (2006.01)

(52) U.S. Cl. ...................... 174/250; 174/255; 174/260; 174/261

(58) Field of Classification Search ................ 174/250, 174/255, 256, 254, 261, 258, 260; 361/784, 361/741, 756, 802, 777, 760; 439/68, 70; 29/825, 829, 846; 257/797, 787
See application file for complete search history.

(56) References Cited

U.S. PATENT DOCUMENTS

| | | | | |
|---|---|---|---|---|
| 5,373,625 A | * | 12/1994 | Shirasaki | 29/611 |
| 5,777,392 A | * | 7/1998 | Fujii | 257/797 |
| 6,320,135 B1 | * | 11/2001 | Saito | 174/250 |
| 6,472,726 B1 | | 10/2002 | Hashimoto | |
| 6,555,400 B1 | * | 4/2003 | Farnworth et al. | 438/17 |
| 2003/0017653 A1 | * | 1/2003 | Yoshino et al. | 438/126 |

FOREIGN PATENT DOCUMENTS

| | | |
|---|---|---|
| JP | 08-056062 | 2/1996 |
| JP | 10-135600 | 5/1998 |
| JP | 11-186439 | 7/1999 |
| KR | 2001-0000254 | 1/2001 |
| WO | 00/07235 | 2/2000 |

* cited by examiner

*Primary Examiner*—Kamand Cuneo
*Assistant Examiner*—Ishwar (I. B.) Patel
(74) *Attorney, Agent, or Firm*—Hogan & Hartson, L.L.P.

(57) ABSTRACT

A substrate supporting a plurality of interconnecting patterns arranged in matrix is cut at a position at least between adjacent columns of the interconnecting patterns. A plurality of positioning marks are formed on the substrate and arranged on a straight line between adjacent columns of the interconnecting patterns. Cutting of the substrate is performed by using the positioning marks as reference.

8 Claims, 6 Drawing Sheets

WIRING BOARD AND METHOD OF FABRICATING TAPE-LIKE WIRING SUBSTRATE

Japanese Application No. 2002-51340, filed on Feb. 27, 2002, is hereby incorporated by reference in its entirety.

BACKGROUND OF THE INVENTION

The present invention relates to a wiring board and a method of fabricating a tape-like wiring substrate.

As a fabrication method for a wiring board, there is known one wherein a plurality of interconnecting patterns are formed in matrix (plural rows×plural lines) on a single substrate. The wiring board is cut in each line of interconnecting patterns thereby giving plural lines of tape-like wiring substrates.

However, conventional cutting processes cannot provide a tape-like wiring substrate of a constant width which has interconnecting patterns located at predetermined positions, because cutting positions cannot be recognized in the course of the cutting process. If there are various types of tape-like wiring substrates having different widths, the positions of such tape-like wiring substrates vary in conveyance rails, making it impossible to do precise positioning for interconnecting patterns, for example.

BRIEF SUMMARY OF THE INVENTION

According to one aspect of the present invention, there is provided a wiring board comprising:
a substrate;
a plurality of interconnecting patterns arranged in matrix on the substrate; and
a plurality of positioning marks formed on the substrate and arranged on a straight line between adjacent columns of the interconnecting patterns.

According to another aspect of the present invention, there is provided a method of fabricating a tape-like wiring substrate, comprising cutting a substrate which supports a plurality of interconnecting patterns arranged in matrix, at least in a region between adjacent columns of the interconnecting patterns, wherein:
the substrate has a plurality of positioning marks arranged on a straight line between adjacent columns of the interconnecting patterns; and
the substrate is cut by using the positioning marks as references.

DETAILED DESCRIPTION OF THE EMBODIMENT

Figure 1:
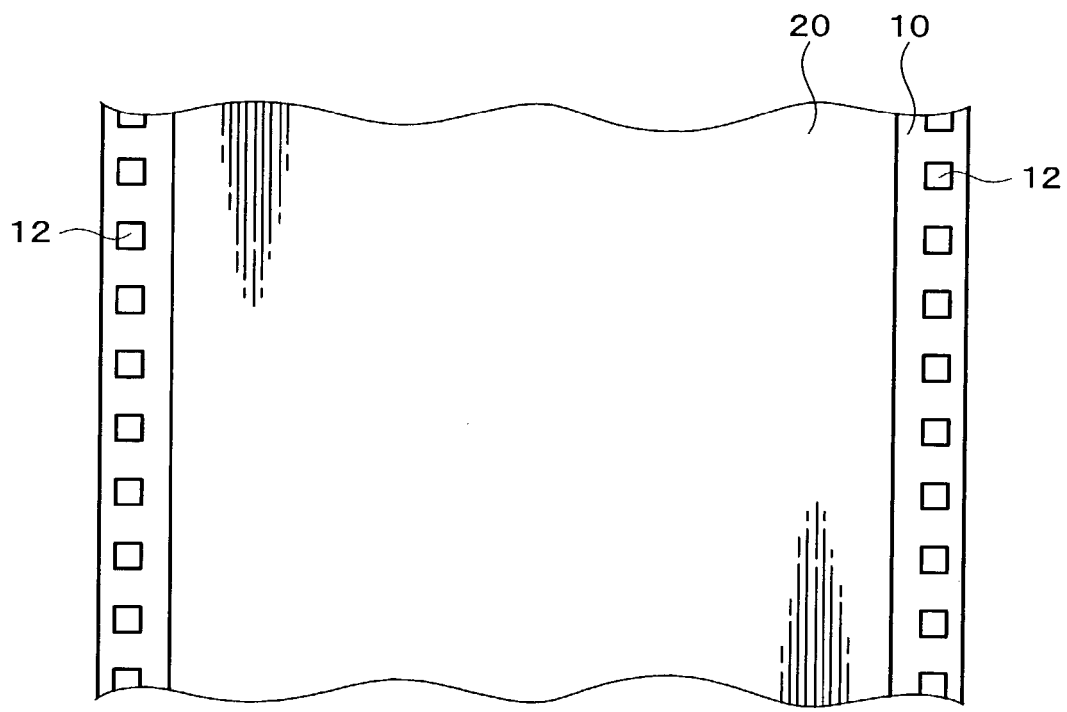
FIG. 1 is a diagram for illustrating a method of fabricating a wiring board according to one embodiment of the present invention.

Embodiments of the present invention enables to precisely cut a wiring board by recognizing positioning marks.

(1) According to one embodiment of the present invention, there is provided a wiring board comprising:
a substrate;
a plurality of interconnecting patterns arranged in matrix on the substrate; and
a plurality of positioning marks formed on the substrate and arranged on a straight line between adjacent columns of the interconnecting patterns.

In this configuration, the positioning marks are arranged on a straight line between adjacent columns of the interconnecting patterns. This enables to precisely cut the wiring board by using the positioning marks. Therefore, a tape-like wiring substrate having a constant width can be easily fabricated, for example.

(2) In this wiring board, the positioning marks may be formed of the same material and by the same method as the interconnecting patterns.

This makes it possible to form the positioning marks in a small number of steps.

(3) In this wiring board, the positioning marks may have references for defining an imaginary straight line.

This makes it possible to cut the wiring board at an optimum position.

(4) In this wiring board, the positioning marks may have references for defining a range in a widthwise direction of the straight line on which the positioning marks are arranged.

This makes it possible to place the cutting position of the substrate within a predetermined range in the widthwise direction.

(5) In this wiring board, each of the positioning marks may have a V-shape which is symmetrical with respect to the straight line on which the positioning marks are arranged.

(6) This wiring board may further comprise a plating lead electrically connected to the interconnecting patterns, wherein:
the plating lead includes sections intersecting the straight line on which the positioning marks are arranged; and
part of the sections of the plating lead form the positioning marks.

Since the positioning marks are part of the plating lead, the number of components can be reduced, leading to the cost reduction.

(7) According to one embodiment of the present invention, there is provided a method of fabricating a tape-like wiring substrate, comprising cutting a substrate which supports a plurality of interconnecting patterns arranged in matrix, at least in a region between adjacent columns of the interconnecting patterns, wherein:

the substrate has a plurality of positioning marks arranged on a straight line between adjacent columns of the interconnecting patterns; and the substrate is cut by using the positioning marks as references.

In this method, the substrate is cut by using the positioning marks arranged on a straight line between adjacent columns of the interconnecting patterns as reference. This enables to cut the wiring board at a precise position while recognizing the positioning marks. Therefore, a tape-like wiring substrate having a constant width can be easily fabricated.

(8) In this method of fabricating a tape-like wiring substrate, the positioning marks may be formed from the same material and by the same method as the interconnecting patterns.

This makes it possible to form the positioning marks in a small number of steps.

(9) In this method of fabricating a tape-like wiring substrate, the positioning marks may have references for defining an imaginary straight line; and the substrate may be cut along the imaginary straight line in the cutting step.

This makes it possible to cut the wiring board at an optimum position.

(10) In this method of fabricating a tape-like wiring substrate, the positioning marks may have references for defining a range in a widthwise direction of the straight line on which the positioning marks are arranged; and the cutting of the substrate may be done within the range in the widthwise direction.

If the cutting position is within the range defined by the above-described references, a tape-like wiring substrate having a substantially constant width can be fabricated even if the cutting position is shifted in a direction intersecting the cutting direction.

(11) In this method of fabricating a tape-like wiring substrate, each of the positioning marks may have a V-shape which is symmetrical with respect to the straight line on which the positioning marks are arranged; and the cutting of the substrate may be done within the V-shape.

(12) In this method of fabricating a tape-like wiring substrate, a plating lead electrically connected to the interconnecting patterns may be formed on the substrate;

the plating lead may include sections intersecting the straight line on which the positioning marks are arranged; and part of the sections of the plating lead may form the positioning marks.

Since the positioning marks are part of the plating lead, the number of components can be reduced, leading to the cost reduction.

(13) In this method of fabricating a tape-like wiring substrate, the substrate may be put on a pair of reels; and the cutting of the substrate may be done while the substrate is being spooled from one reel to the other reel.

Further embodiments of the present invention will be described with reference to the accompanying drawings. It is noted, however, that the invention is not limited to the following embodiments.

Figure 2A:
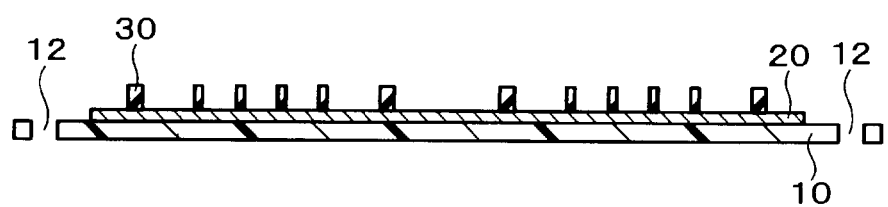
FIGS. 2A and 2B are diagrams for illustrating a method of fabricating a wiring board according to one embodiment of the present invention.
Figure 2B:
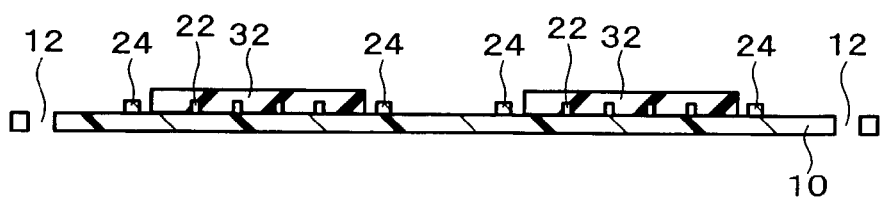
Figure 3:
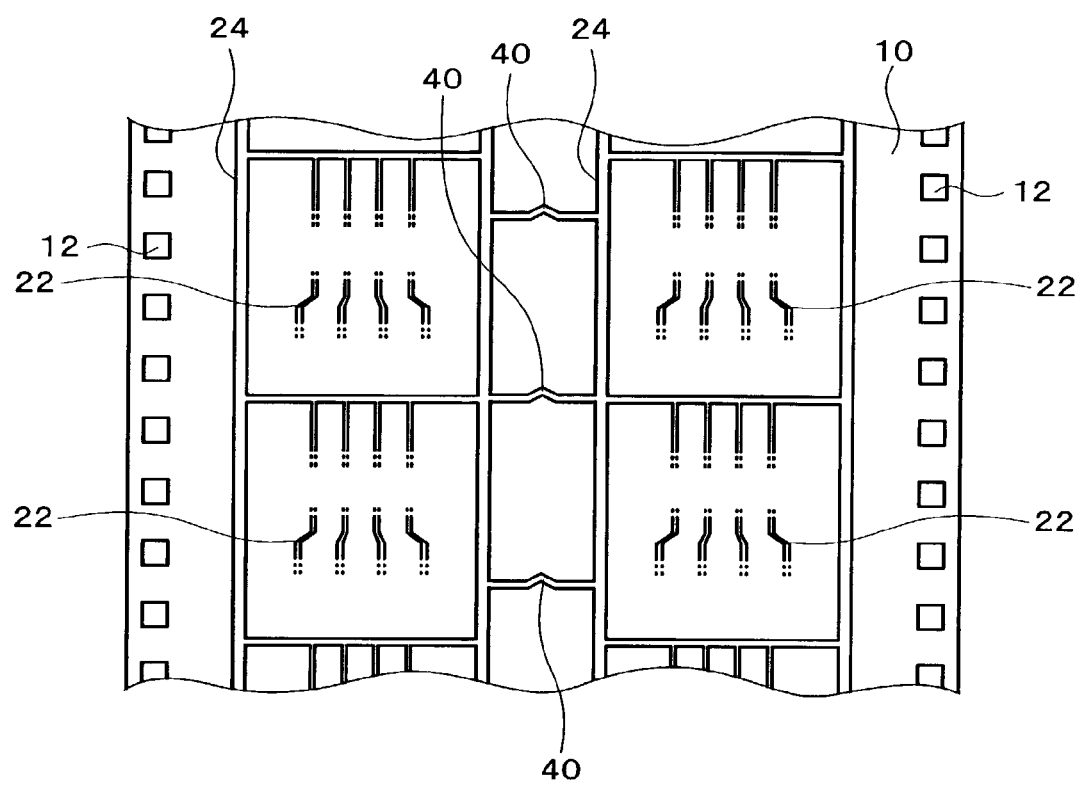
FIG. 3 is a diagram for illustrating a method of fabricating a wiring board according to one embodiment of the present invention.
Figure 4:
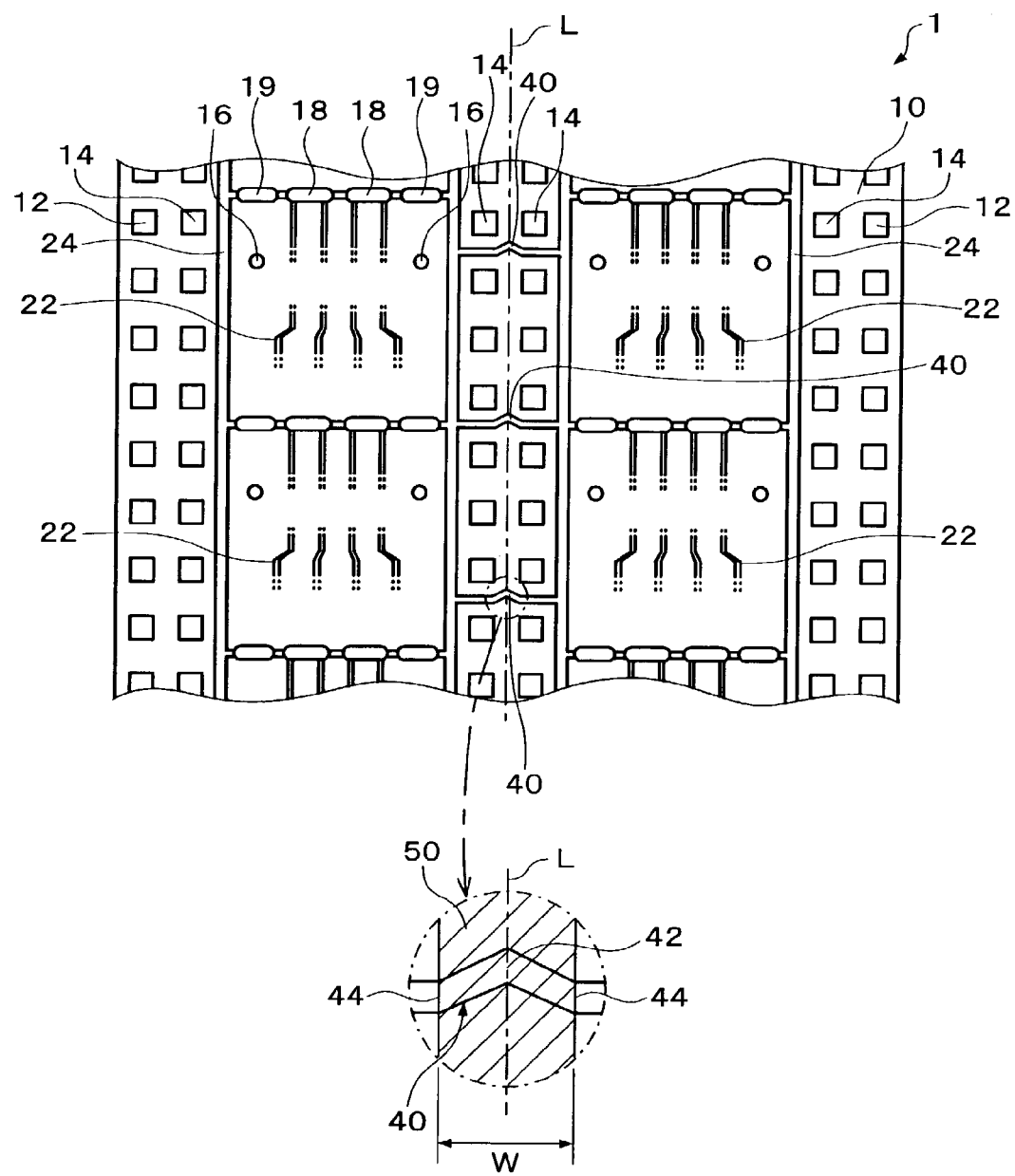
FIG. 4 is a diagram showing a wiring board according to one embodiment of the present invention.
Figure 5:
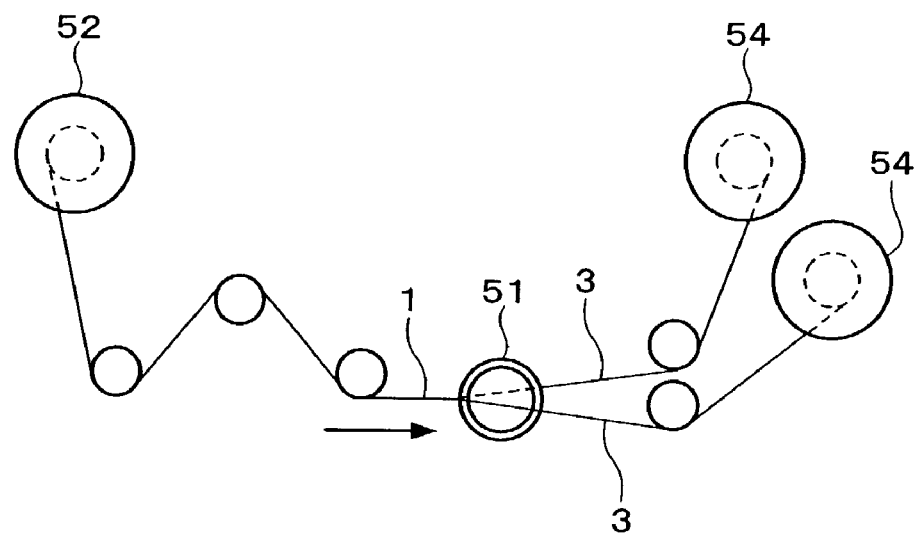
FIG. 5 is a diagram for illustrating a method of fabricating a tape-like wiring substrate according to one embodiment of the present invention.
Figure 6:
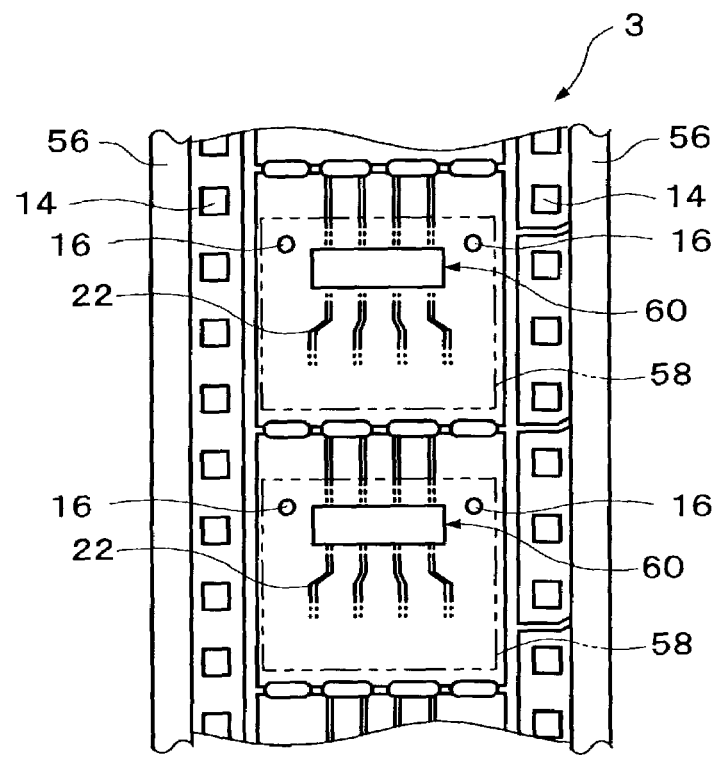
FIG. 6 is a diagram for illustrating a method of fabricating a semiconductor device according to one embodiment of the present invention.

FIGS. 1 to 4 are diagrams illustrating a fabrication method for wiring board according to one embodiment of the invention. FIG. 4 shows a wiring board of this embodiment. FIG. 5 is a diagram for illustrating a fabrication method for tape-like wiring substrate according to this embodiment, and FIG. 6 is a diagram for illustrating a tape-like wiring substrate according to this embodiment. According to this embodiment of the invention, a wiring board represents a board which is formed with a plurality of interconnecting patterns arranged in matrix, or which may be called a matrix wiring board. A tape-like wiring substrate represents a wiring board which is in an elongate form, having a plurality of interconnecting patterns arranged in a single line along one direction.

As shown in FIGS. 1 to 4, a method of fabricating a wiring board will be described. Firstly, a substrate 10 is prepared in this embodiment.

The substrate 10 may be formed from an organic material, such as polyimide. In the embodiment, a flexible substrate is used as the substrate 10, which may be a substrate for COF (Chip On Film) or TAB (Tape Automated Bonding). The material for the substrate 10 is not limited to the above and the substrate may be formed from any of the inorganic materials which are severable (such as, for example, ceramics, glass and glass epoxy).

In this embodiment, the substrate 10 has an elongated shape (or tape-like shape). FIG. 1 shows the substrate 10 with its both ends omitted. By spooling both ends of the substrate 10 on reels (not shown), reel-to-reel conveyance of the substrate is enabled. This allows for a flow production of wiring boards, which contributes to the increase of productivity and to the reduction of fabrication costs.

In another mode, the substrate 10 may have a shape including plural polygons such as a square and a rectangle. Thus, the substrate is not limited in shape.

The substrate 10 is provided with a conductive foil 20 such as of a copper foil or the like. The conductive foil 20 may include a single layer or multiple layers. The conductive foil 20 is patterned to form a conductive pattern (interconnecting pattern 22 and plating lead 24). The conductive foil 20 may be formed over a surface of the substrate 10 except for its opposite ends, as shown in FIG. 1. Otherwise, the conductive foil may be overlaid on the overall surface of the substrate 10.

In this embodiment, the conductive foil 20 is bonded to the substrate 10 by means of an adhesive (not shown), thus forming a three-layered board. In this case, the interconnecting pattern 22 and plating lead 24 may be formed using a photolithographic technique followed by an etching process, as will be described later (see FIG. 2A). Otherwise, the known technique such as sputtering or additive process may be used to form the interconnecting pattern 22 and plating lead 24 directly on the substrate 10.

There are formed holes 12, as shown in FIG. 1. The holes 12 serve as references for positioning a conductive pattern (the interconnecting pattern 22, in particular) on the substrate 10. In other words, a plurality of interconnecting patterns 22 can be formed at predetermined positions on the substrate 10 by recognizing the positions of the holes 12.

As shown in FIG. 1, the holes 12 having the same configuration (the same shape and size) may be formed. In this case, the plural holes 12 may be formed in a regular arrangement (based on the same array pattern). In the example shown in FIG. 1, the plural holes 12 are arranged at transversely opposite ends (side-to-side direction as seen in FIG. 1) of the substrate 10 along a longitudinal direction of the substrate 10 (vertical direction as seen in FIG. 1). The plural holes 12 are arranged in a line on each of the opposite ends of the substrate 10. The holes 12 of the substrate 10 has a constant longitudinal pitch (center-to-center distance). It is noted that the plural holes 12 may be meshed with a sprocket (not shown) so as to serve as conveyance holes, as well.

Subsequently, the conductive patterns are formed with reference to the holes 12. According to this embodiment, a positioning marks 40 are also formed as part of the conductive patterns (specifically, part of the plating lead 24). The positioning marks 40 and the interconnecting patterns 22 are formed from the same material by the same process at the same time. This provides for an easy formation of the positioning marks 40 in a small number of steps. The positioning mark 40 is used for determining a position at which the wiring board is cut (for example, a position with respect to a widthwise direction of the substrate 10).

As shown in FIG. 2A, a photosensitve resist 30 (positive or negative type) is formed on the conductive foil 20. The resist 30 is overlaid on the overall surface of the conductive foil 20, subjected to predetermined steps (light exposure and development and the like) and then, selectively patterned with reference to the holes 12. Subsequently, an area of the conductive foil 20 that is exposed from the resist 30 is etched. That is, the resist 30 is used as mask for forming the plural interconnecting patterns 22 and plating lead 24. In another mode, the resist 30 may be formed by, for example, a printing process, ink-jet process or the like. In such cases, the resist 30 is patterned with reference to the holes 12.

Subsequently, a protective film 32 (solder resist, for instance) is formed on the substrate 10 in a manner to cover the plural interconnecting patterns 22, as shown in FIG. 2B. The protective film 32 may be patterned with reference to the holes 12.

Thus, as shown in FIG. 3, a plural number of interconnecting patterns 22 (four patterns in FIG. 3) are formed centrally of the substrate 10 as arranged in matrix or in plural rows and lines (two rows and lines in FIG. 3). The interconnecting pattern 22 includes plural wirings, each of which has two or more terminals (lands, for instance). All or a part of the plural interconnecting patterns 22 are electrically connected by means of the plating lead 24. The plating lead 24 extends longitudinally and transversely of the substrate 10, thereby defining the individual interconnecting patterns 22. The plural interconnecting patterns 22 can be electrically plated by forming the plating leads 24. Note that part of the plating lead 24 form the positioning marks 40 in this embodiment.

Next, the interconnecting patterns 22 are electrically plated so that a metal coating film (such as metal plated coating film) is formed on the plural terminals of the interconnecting patterns 22. More specifically, a part of the interconnecting pattern 22 is exposed from the protective film 30 and then, the metal coating film is laid over the exposed portion.

As shown in FIG. 4, two or more types of holes (first and second holes 14, 16 as shown in FIG. 4) are formed centrally of the substrate 10 with reference to the holes 12. The two or more types of holes may be formed collectively (simultaneously). These holes are used for the purpose of positioning relative to the interconnecting patterns 22. That is, the holes are targets of positioning in place of the interconnecting patterns 22. Otherwise, these holes together with the interconnecting patterns 22 are targets of positioning. The holes are differentiated in the configurations thereof (position, shape, size and the like) according to the use of the holes (to be used together with the interconnecting patterns 22 as targets of positioning or not). These holes may be formed by punching.

The first holes 14 may be used for positioning a semiconductor chip 60, to be mounted, relative to the interconnecting pattern 22 (see FIG. 6). In an example shown in FIG. 4, the first holes 14 are formed on opposite ends with respect to the widthwise direction of the substrate 10 of an area constituting the interconnecting patterns 22 arranged in one line longitudinally of the substrate 10, (the first holes formed in one line on each of the opposite ends). The first holes 14 has a constant pitch (center-to-center distance) with respect to the longitudinal direction of the substrate 10. The first holes 14 are formed externally of a plating lead portion 24 enclosing a single interconnecting pattern 22.

As shown in FIG. 4, the first hole 14 may be formed in plural numbers and in the same configuration (the same shape and size). In this case, the first holes 14 may be formed in a regular arrangement (based on the same array pattern). Further, the plural first holes 14 may be formed in the same configuration as the holes 12 and arranged at the same pitch as the holes 12 along the longitudinal direction of the substrate 10.

Figure 7:
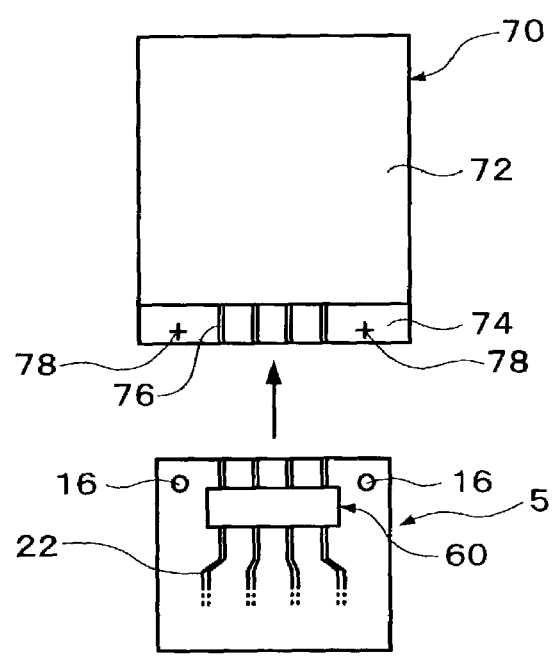
FIG. 7 is a diagram for illustrating a method of fabricating an electrooptic device according to one embodiment of the present invention.

The second hole 16 may be used for positioning the interconnecting pattern 22 relative to another wiring board 70 (see FIG. 7). Similarly to the first hole 14, the second hole 16 may also be used for positioning between the semiconductor chip 60 to be mounted and the interconnecting pattern 22.

As shown in FIG. 4, the second hole 16 is formed internally of the plating lead portion 24 enclosing a single interconnecting pattern 22. The second hole 16 may be formed in plural numbers. The second holes 16 may be formed at symmetrical places with respect to an axis (not shown) of the area defining a single interconnecting pattern 22, the axis extending along the longitudinal direction of the substrate 10. That is, a left-hand second hole 16 may be formed at an axially symmetrical place relative to a right-hand second hole 16. In this case, the plural wirings of the interconnecting pattern 22 at least include a portion extended longitudinally of the substrate 10, respectively, while the terminals of the wirings are aligned transversely of the substrate 10. Thus, the recognition of the second holes 16 permits the plural terminals of the interconnecting pattern 22 to be electrically connected with precise places of another electronic component (another wiring board 70, for instance).

It is noted that the plural second holes 16 may be formed in the same configuration as shown in FIG. 4 or in different configurations. The two second holes 16 formed in different configurations in side-by-side relation are effective at preventing a wrong orientation of the interconnecting pattern 22, which, for example, is electrically connected with another wiring board 70.

Additionally to the aforementioned first and second holes 14, 16, there may be formed holes 18 used for severing a part of the plating lead 24. The hole 18 may be formed by punching out a part of the plating lead 24, protective film 32 and substrate 10. The hole 18 may be a slit (elongate hole) as shown in FIG. 4, or may take another shape such as a round hole or the like.

Besides the aforementioned first and second holes 14, 16, there may be formed holes 19 between adjoining interconnecting patterns 22 arranged longitudinally of the substrate 10. In the example shown in FIG. 4, the hole 19 is a slit (elongate hole), which facilitates bending the substrate 10 at place between the adjoining interconnecting patterns 22. This contributes to an easy handling of the interconnecting patterns 22. Incidentally, the holes 18 used for severing the plating lead 24 may also serve as the holes 19 facilitating bending the substrate 10, as shown in FIG. 4.

In this manner, a wiring board 1 (matrix wiring board) shown in FIG. 4 can be fabricated. The wiring board 1 includes a plurality of interconnecting patterns 22 arranged in matrix, and the plating lead 24 partially defining the positioning marks 40.

The plural positioning marks 40 are arranged in a straight line interposed between the pairs of adjoining interconnecting patterns 22 (transversely adjoining pairs with respect to the substrate 10 as seen in FIG. 4). In the example shown in FIG. 4, the positioning marks 40 are arranged on a line centrally of the substrate 10. In a case where the interconnecting patterns 22 are formed in three or more lines arranged transversely of the substrate 10, the positioning marks 40 are disposed between respective pairs of transversely adjoining interconnecting patterns, thus arranged in 2 or more lines centrally of the substrate 10.

According to the example shown in FIG. 4, the positioning marks 40 are formed only between adjacent interconnecting patterns 22. That is, the positioning marks 40 are not formed at opposite ends of the substrate 10, which are cut concurrently with the area between the adjacent interconnecting patterns 22. Even if the positioning marks 40 are not provided on the opposite ends of the substrate 10, using a pair of cutting jigs having a constant width enables to precisely cut a cutting position in the end of the substrate 10 of the wiring board 1 by precisely cutting a cutting position between the adjacent interconnecting patterns 22 according to the positioning marks 40.

In an example alternative to that of FIG. 4, the positioning marks 40 may be formed on the transversely opposite ends of the substrate 10 (specifically, at place between the holes 12 and the first holes 14). In this case, the positioning marks 40 may be arranged in a straight line centrally between the holes 12 and the first holes 14.

In this embodiment, the positioning marks 40 are sequentially provided along the longitudinal direction of the substrate 10. In this case, the positioning marks 40 may be formed in the same configuration (the same shape and size) or may be arranged longitudinally at a constant pitch (center-to-center distance). In the example of FIG. 4, the positioning marks 40 are arranged at regular space intervals of a plural number of first holes 14 (three holes 14 in FIG. 4). In other words, the positions of the plural positioning marks 40 may be decided based on the first holes 14.

As shown in an enlarged view in FIG. 4, the positioning mark 40 may have references 42 for defining a single imaginary straight line L. In other words, the single imaginary straight line L is defined by the references 42 of the positioning marks 40. This permits the wiring board 1 to be cut at optimum positions along the imaginary straight line L.

As shown in the enlarged view in FIG. 4, the positioning marks 40 may have references 44 for defining a widthwise range 50 with respect to the straight line along which the plural positioning marks 40 are arranged. That is, the references 44 define a given width W including the imaginary straight line L. The range 50 may be equal to a range of allowances (tolerances) for the cutting positions. This permits a tape-like wiring substrate substantially of a constant width to be fabricated so long as displacement of the cutting position in a direction intersecting the cutting direction is within the range 50 defined by the references 44. Therefore, even if a cutting operation cannot achieve such a high precision to cut the wiring board 1 precisely on the imaginary straight line L, products of high quality can be produced without decreasing the productivity.

A value of the width W defined by the references 44 is determined based on the range of allowances (tolerances) for a width of a tape-like wiring substrate 3 given by the cutting operation. Specifically, the width W is decided such that the width (or longitudinal side) of the tape-like wiring substrate 3 may be used as reference for positioning relative to the interconnecting pattern 22. The reference for positioning relative to the interconnecting pattern 22 herein means a reference for visual recognition of the interconnecting pattern 22 or a reference for visual recognition of a mark for recognizing the interconnecting pattern 22.

In this embodiment, the positioning marks 40 constitute a part of the plating lead 24. Specifically, in the example of FIG. 4, the plating lead 24 includes a portion intersecting the straight line along which the plural positioning marks 40 are arranged, and apart of the intersecting portion constitutes the positioning mark 40. Thus, a part of the plating lead 24 defines the positioning mark 40 and hence, the number of components is decreased and the cost reduction results.

As shown in FIG. 4, the positioning mark 40 may be formed in a V-shape (inverted V-shape in FIG. 4). Specifically, the positioning mark 40 has a V-shape which is symmetrical with respect to the straight line along which the plural positioning marks 40 are arranged. The V-shape provides the definition of three points with respect to the widthwise direction of the substrate 10. That is, a central apex of the V-shape represents the reference 42, whereas the two apexes on the opposite sides represent the references 44. Such a configuration provides the definition of a single imaginary line L as well as of the widthwise range 50 including the imaginary line L.

Although part of the plating lead 24 form the positioning mark 40 in this embodiment, the invention is not limited to this. For instance, the positioning mark may take any of modes including a pattern or hole unconnected with the interconnecting pattern 22, and an inked mark or the like, so long as such a mark permits a position on the substrate 10 to be recognized. Any mode that can serve the aforementioned purpose is applicable.

Moreover, the substrate 10 is cut along the longitudinal direction in this embodiment. However, the invention is not limited to this. The invention is applicable to the cutting of the substrate 10 in either directions.

In the wiring board according this embodiment of the invention, the plural positioning marks 40 are arranged on the straight line interposed between the pairs of transversely adjoining interconnecting patterns 22. Thus, the wiring board 1 can be cut at the precise position according to the positioning marks 40 being recognized. Accordingly, it is easy, for example, to fabricate a tape-like wiring substrate 3 of a constant width.

Next, a method of fabricating a tape-like wiring substrate will be described. The method includes a step of cutting the wiring board 1.

As shown in FIG. 5, this embodiment performs a cutting operation using a reel-to-reel conveyance system. Specifically, the wiring board 1 shown in FIG. 4 is put on a pair of reels 52, 54, and the wiring board is cut while the wiring board 1 is being spooled from the reel 52 to the reel 54. If the cutting step provides a plurality of tape-like wiring substrates 3 as shown in FIG. 5, the tape-like wiring substrates 3 may be spooled onto a plurality of the reels 54.

As shown in FIG. 5, a known cutting jig 51, such as a cutter, blade or the like, is disposed at place with its cutting edge oriented along the longitudinal direction of the wiring board 1. The cutting jig 51 may be fixed to place when cutting the wiring board 1. According to the reel-to-reel conveyance system, the cutting is done simply by fixing the cutting jig 51 at place and conveying the wiring board 1. The system reduces moved targets and hence, the cutting position is less prone to shift. Alternatively, the cutting jig 51 maybe adapted to move along the conveyance direction of the wiring board 1 while the wiring board 1 is cut.

A plurality of cutting jigs 51 may be employed for cutting the wiring board 1. For instance, a plurality of cutting jigs 51 having constant widths may be arranged in a width direction of the wiring board 1. In this arrangement, if at least any one of the cutting positions (or a cutting position between the adjacent interconnecting patterns 22) is recognized by way of the positioning marks 40, the other cutting position (in at least one of both ends of the substrate 10) can be precisely determined. Accordingly, a plurality of cutting positions in the wiring board 1 can be cut at a time in a simple step.

The cutting operation is performed to cut the wiring board 1 at a position within the range 50 defined at least by the references 44 of the positioning marks 40. Specifically, the wiring board is cut at place inside of the V-shape (or inside of a recess (or projection) of the V-shape) of the positioning mark 40 shown in FIG. 4. It is further preferred that the wiring board 1 is cut along the imaginary straight line L defined by the references 42 of the positioning marks 40. As sequentially arranged along the longitudinal direction of the wiring board 1, the positioning marks 40 permit the actual cutting position to be recognized at any time during the cutting operation.

In this manner, the tape-like wiring substrate 3, as shown in FIG. 6, is fabricated. The fabrication method provides the tape-like wiring substrate 3 of a constant width. Therefore, a widthwise displacement of the tape-like wiring substrate 3 can be prevented when the tape-like wiring substrate 3 is conveyed on conveyance rails 56 in the subsequent step. Furthermore, the width (the longitudinal side) of the tape-like wiring substrate 3 may be used, for example, as a reference for positioning relative to the interconnecting pattern 22 (including a reference for positioning relative to the mark for recognition of the interconnecting pattern 22).

FIG. 6 is a diagram illustrating a fabrication method for semiconductor device, whereas FIG. 7 is a diagram illustrating a fabrication method for electrooptic device.

A flow operation is performed wherein the plural semiconductor chips 60 (specifically, a chip formed with an integrated circuit) are mounted while the tape-like wiring substrate 3 is conveyed on the conveyance rails 56, as shown in FIG. 6. The tape-like wiring substrate 3 is formed with the first and second holes 14, 16. In this case, at least the first holes 14 may be used as references for positioning the semiconductor chip 60 relative to the interconnecting pattern 22. Alternatively, the semiconductor chip 60 may be positioned relative to the interconnecting pattern 22 based on the recognition of both the first and second holes 14, 16. As mentioned above, this embodiment enables to easily recognize the first or second holes 14, 16.

Subsequent to the mounting of the semiconductor chip, the tape-like wiring substrate 3 is cut into each region 58 defining a single interconnecting pattern 22 thereby to give a piece of wiring board 5. The wiring board piece 5 is formed with the second holes 16.

Subsequently, the above wiring board piece 5 is electrically connected with another wiring board 70 to form an electrooptic device. The electrooptic device is exemplified by a liquid crystal device, plasma display device, electroluminescent display device and the like, and includes an electrooptic material (liquid crystal, electric discharge gas, light emitting material or the like).

The other wiring board 70 may be, for example, a panel constituting a display unit. The panel includes a lamination of an upper substrate 72 and a lower substrate 74 which is formed with a predetermined interconnecting pattern 76. The lower substrate 74 is also formed with a positioning mark 78. The second holes 16 of the wiring board piece 5 are registered with the marks 78 of the other wiring board 70 so that the interconnecting patterns 22, 76 of these boards are electrically interconnected.

Figure 8:
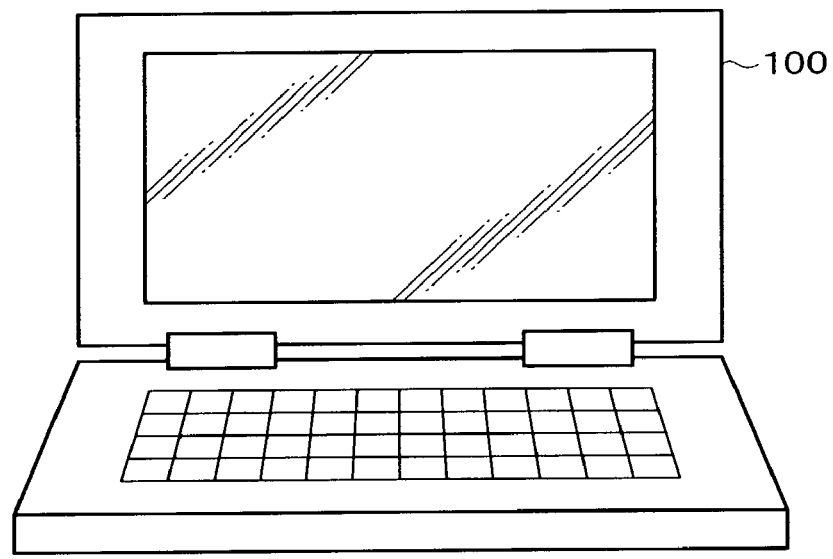
FIG. 8 is a diagram showing an electronic instrument according to one embodiment of the present invention.
Figure 9:
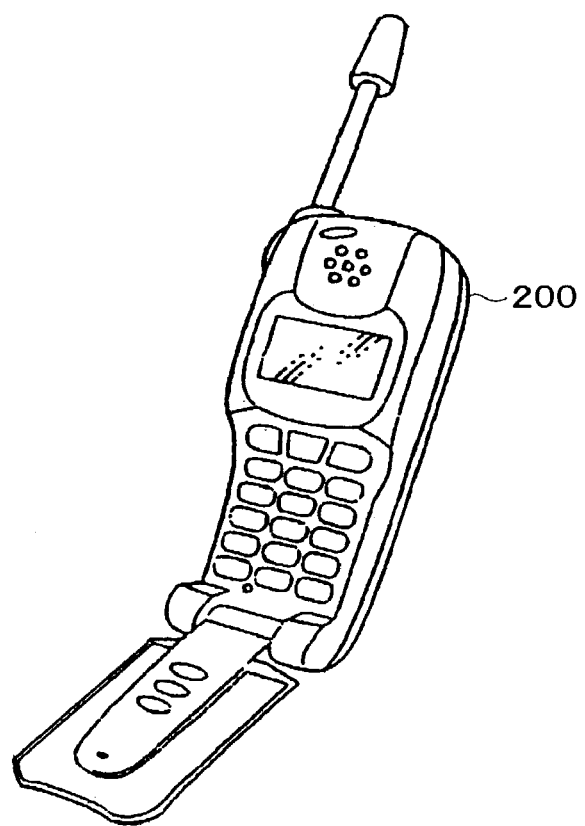
FIG. 9 is a diagram showing an electronic instrument according to one embodiment of the present invention.

As examples of an electronic device including the semiconductor device according to embodiments of the present invention, a notebook personal computer 100 is shown in FIG. 8, whereas a cellular phone 200 is shown in FIG. 9.

The present invention is not limited to the above-described embodiments, and various modifications can be made. For example, the present invention includes various other configurations substantially the same as the configurations described in the embodiments (in function, method and effect, or in objective and effect, for example). The present invention also includes a configuration in which an unsubstantial portion in the described embodiments is replaced. The present invention also includes a configuration having the same effects as the configurations described in the embodiments, or a configuration able to achieve the same objective. Further, the present invention includes a configuration in which a publicly known technique is added to the configurations in the embodiments.

What is claimed is:

1. A wiring board comprising:
   a substrate;
   a plurality of interconnecting patterns arranged in matrix on the substrate; and
   a plurality of positioning marks formed on the substrate and arranged on a straight line between adjacent columns of the interconnecting patterns, each of the positioning marks has a V-shape which is symmetrical with respect to the straight line,
   a plating lead electrically connected to the interconnecting patterns, wherein, the plating lead includes sections intersecting the straight line; and part of the sections of the plating lead intersecting the straight line form the positioning marks.

2. The wiring board as defined in claim 1,
   wherein the positioning marks are formed of the same material and by the same method as the interconnecting patterns.

3. The wiring board as defined in claim 1,
   wherein the positioning marks have references for defining the straight line.

4. The wiring board as defined in claim 1,
   wherein the positioning marks have references for defining a range in a widthwise direction intersecting the straight line.

5. A wiring board comprising:
   a substrate;
   a plurality of interconnecting patterns arranged in matrix on the substrate and
   a plating lead electrically connected to the interconnecting patterns, the plating lead including first portions to form a plurality of positioning marks, the positioning marks formed on the substrate and arranged on a straight line between adjacent columns of the interconnecting patterns, the plating lead including second portions extending contiguously from the positioning marks in a width direction of the substrate, wherein no lead extends contiguously from the positioning marks in a length direction of the substrate, wherein, each of the positioning marks has a V-shape which is symmetrical with respect to the straight line.

6. The wiring board as defined in claim 5, wherein the positioning marks are formed of the same material and by the same method as the interconnecting patterns.

7. The wiring board as defined in claim 5, wherein the positioning marks have references for defining the straight line.

8. The wiring board as defined in claim 5, wherein the positioning marks have references for defining a range in a widthwise direction intersecting the straight line.

* * * * *